United States Patent
O'Keeffe et al.

(10) Patent No.: US 10,067,171 B2
(45) Date of Patent: Sep. 4, 2018

(54) ACTIVE ANTENNA SYSTEM AND METHODS OF DETERMINING INTERMODULATION DISTORTION PERFORMANCE

(71) Applicant: ANALOG DEVICES GLOBAL

(72) Inventors: Conor O'Keeffe, Co. Cork (IE); Joe Moore, Dublin (IE)

(73) Assignee: Analog Devices Global, Hamilton (BM)

(*) Notice: Subject to any disclaimer, the term of this patent is extended or adjusted under 35 U.S.C. 154(b) by 0 days.

(21) Appl. No.: 15/129,746

(22) PCT Filed: Apr. 8, 2015

(86) PCT No.: PCT/EP2015/057598
§ 371 (c)(1),
(2) Date: Sep. 27, 2016

(87) PCT Pub. No.: WO2015/155225
PCT Pub. Date: Oct. 15, 2015

(65) Prior Publication Data
US 2017/0176507 A1    Jun. 22, 2017

(30) Foreign Application Priority Data

Apr. 8, 2014 (GB) .................. 1406330.9

(51) Int. Cl.
*H04B 17/00* (2015.01)
*G01R 29/10* (2006.01)
(Continued)

(52) U.S. Cl.
CPC ............ *G01R 29/10* (2013.01); *H01Q 1/00* (2013.01); *H04B 1/0466* (2013.01);
(Continued)

(58) Field of Classification Search
CPC .... G01R 29/10; H04B 17/102; H04B 17/104; H04B 17/12; H04B 17/14; H04B 1/0466; H04B 1/0483; H01C 1/00
See application file for complete search history.

(56) References Cited

U.S. PATENT DOCUMENTS 5,875,391 A    2/1999 Riley et al.
6,339,712 B1   1/2002 Toivola
(Continued)

FOREIGN PATENT DOCUMENTS

CN    101283293    10/2008
CN    201955471 U  8/2011
(Continued)

OTHER PUBLICATIONS

"International Application No. PCT/EP2015/057598, International Search Report dated Jun. 30, 2015", 4 pgs.
(Continued)

*Primary Examiner* — Nguyen Vo
(74) *Attorney, Agent, or Firm* — Knobbe, Martens, Olson & Bear, LLP

(57) ABSTRACT

An active antenna test system comprising an active antenna unit comprising: a test signal generator arranged to generate at least a first test signal and at least one second test signal; a plurality of transmitter modules operably coupled to the test signal generator wherein the plurality of transmitter modules are arranged to simultaneously process the first test signal and at least one second test signal to produce at least one radio frequency test signal therefrom; and at least one receiver module arranged to process one or more signals falling in at least one spectral band determined to be susceptible to intermodulation distortion products caused by the at least one radio frequency test signal being generated from the first test signal and at least one second test signal; and an intermodulation determination module operably (Continued)

coupled to the at least one receiver module and arranged to determine a first received intermodulation performance. A first transmitter module of the plurality of transmitter modules is operably uncoupled from the test signal generator and at least a first test signal and at least one second test signal re-applied to the remaining transmitter modules, such that the intermodulation determination module determines a second received intermodulation performance in order to determine an intermodulation distortion contribution of the first transmitter module therefrom.

24 Claims, 5 Drawing Sheets

(51) Int. Cl.
    *H04B 17/14*     (2015.01)
    *H01Q 1/00*     (2006.01)
    *H04B 1/04*     (2006.01)
    *H04B 17/10*     (2015.01)
    *H04B 17/12*     (2015.01)

(52) U.S. Cl.
    CPC ......... *H04B 1/0483* (2013.01); *H04B 17/102* (2015.01); *H04B 17/104* (2015.01); *H04B 17/12* (2015.01); *H04B 17/14* (2015.01)

(56) References Cited

U.S. PATENT DOCUMENTS

| | | | |
|---|---|---|---|
| 8,498,582 | B1 | 7/2013 | Bradley |
| 8,565,347 | B2 | 10/2013 | Blech |
| 2004/0048576 | A1* | 3/2004 | Hildebrand ............ H04B 1/525 455/67.13 |
| 2007/0077890 | A1 | 4/2007 | Drabeck et al. |
| 2016/0099733 | A1* | 4/2016 | Weissman ............ H04B 17/354 455/114.2 |

FOREIGN PATENT DOCUMENTS

| | | |
|---|---|---|
| CN | 102944757 | 2/2013 |
| CN | 103684638 A | 3/2014 |
| DE | 202010014605 U1 | 12/2010 |
| EP | 2375571 | 10/2011 |
| JP | 2000060757 | 7/2002 |
| WO | WO-9739597 A1 | 10/1997 |
| WO | WO 2007-096683 | 8/2007 |
| WO | WO 2013121092 | 8/2013 |
| WO | WO 2014-028239 | 2/2014 |

OTHER PUBLICATIONS

Combined Search and Examination Report dated Sep. 23, 2014 for United Kingdom Patent Application No. GB1406330.9.
Chinese Office Action dated Jun. 5, 2018 for Chinese Patent Application No. 201580018974.5, 5 pages.

* cited by examiner

FIG. 1 – Prior Art

ACTIVE ANTENNA SYSTEM AND METHODS OF DETERMINING INTERMODULATION DISTORTION PERFORMANCE

CLAIM OF PRIORITY

This application is a U.S. National Stage Filing under 35 U.S.C. § 371 from International Patent Application No. PCT/EP2015/057598, titled "ACTIVE ANTENNA SYSTEM AND METHODS OF DETERMINING INTERMODULATION DISTORTION PERFORMANCE," filed on Apr. 8, 2015, which claims the benefit of priority of United Kingdom Patent Application No, 1406330.9, titled "ACTIVE ANTENNA SYSTEM AND METHODS OF DETERMINING INTERMODULATION DISTORTION PERFORMANCE," filed Apr. 8, 2014, the benefit of priority of each of which is hereby presently claimed, and each of which is hereby incorporated by reference herein in its entirety.

FIELD OF THE INVENTION

The field of this invention relates to an antenna arrangement and methods of testing, and in particular an antenna arrangement and a method of determining an intermodulation distortion performance of one or more components and compensation therefor.

BACKGROUND OF THE INVENTION

In a traditional radio network comprising a base station and passive antenna system, for example, at least one connectorised 50Ω port is generally located on the passive antenna system and at least one connectorised 50Ω port is generally located on the basestation. These connectorised 50Ω ports allow signals to be passed there between via at least one 50Ω connectorised cable. The connectors on the base station are typically 7/16 DIN radio frequency (RF) connectors or N-type RF connectors.

Wireless communication systems are prone to intermodulation distortion (IMD), affecting performance of desired communications, which is often an artefact of non-linear behaviour of signal processing elements within transmitters/receivers of passive antenna systems. Intermodulation can be generated by both active components, for example solid state electronics, and passive components, for example antennae, filters and connectors.

Passive intermodulation (PIM), is a known issue in passive antenna systems and is caused by signal, or signals, undergoing an undesired non-linear mixing to generate an interference frequency component as an artefact.

Due to the non-linear nature of some signal processing elements within the passive antenna system, fundamental frequency components can become distorted, thereby leading to a decaying series of higher order harmonic frequency components in the frequency domain. If these generated (undesired) harmonic frequency components mix again with the fundamental frequencies the resultant artefact signal may fall within a receive band of that processed by the passive antenna system, they can effectively block real communications/communication channels, for example by making a base station receiver believe that a real carrier is present when there is not. Generally, the IMD components of concern are $3^{rd}$, $5^{th}$ and $7^{th}$ order, where the third order is of greatest signal strength and, therefore, often of primary concern.

Network operators have stipulated that antenna suppliers guarantee a certain level of PIM performance, which must be maintained over the lifetime of the supplied antennas. PIM performance can be affected after deployment by, for example, oxidation of connectors and/or printed circuit boards (PCBs). In the case of degraded PIM performance, network operators have forced many antenna manufacturers to replace entire networks of antenna installations at the antenna manufacturers cost. As a result, network operators need to test and maintain their network of antenna installations in order to highlight any degradation in PIM performance. Existing PIM testing techniques rely on the at least one connectorised 50Ω port for inserting test signals into the passive antenna system.

Passive antenna systems are often tested for PIM performance by inputting two fixed high power carrier frequencies into at least one connectorised 50Ω port and measuring the resultant IMD artefact presented on the same connectorised 50Ω port.

Regarding active antenna systems (AASs), similar PIM and IMD issues exist. However, traditional IMD testing techniques cannot be utilised as AASs do not provide at least one connectorised 50Ω port.

Referring to FIG. 1, a simplified block diagram of a traditional active antenna system 100 is illustrated. The example AAS 100 comprises a common public radio interface (CPRI) 102, for interfacing to a baseband processing unit of a cellular base station, such as a third generation partnership project (3GPP™) evolved NodeB (eNodeB). The cellular base station comprises base band circuits that perform demodulation decoding in the receive path and modulation encoding in the transmit path. Multiple-in/multiple-out (MIMO) data for example is transferred between the base station and the AAS 100 in LTE mode operation. The AAS 100 further comprises one or more of its own baseband processing circuits 104, which are arranged to perform functions including but not limited to for example system control, beamform manipulation and additional signal processing.

The AAS 100 comprises a plurality of parallel transceiver circuits 106 operably coupled via a switched coupler structure 108 to an antenna arrangement 110 comprising an array of cross-polarised antenna elements. At least one transmit module 112 and at least one receive module 114 within the transceiver 106 are also operably connected to the antenna arrangement 110, as shown. A further transceiver path 114 provides a dedicated common calibration transceiver path to a calibration transceiver 116.

In a transmit mode, the output from transmit module 112 is fed into the antenna arrangement 110 via a duplexer 118 and coupler structure 120. In a receive mode, each receive circuit 114 is operably coupled, via the coupler structure 120, to the antenna arrangement that is capable of receiving signals.

The inventors of the present invention have recognised and appreciated a desire to validate IMD and PIM performance in such an AAS, as well as provide a field-deployable test regime so that a performance over the lifetime of the AAS can be monitored.

Furthermore, the inventors of the present invention have recognised and appreciated a desire to provide self-test modes within such an AAS. In this manner, external test equipment may not be required if the AAS is serviced when installed at a cellular site. In addition, the inventors of the present invention have recognised and appreciated a desire to be able to remotely invoke self-test modes, or schedule them locally for a particular AAS, so that service personnel may not be required to visit installed cellular sites.

Also, if it is determined that the AAS is not performing correctly or within predefined performance limits, the inventors of the present invention have recognised and appreciated a desire to provide a system for an AAS that allows self-healing (e.g. determination that a problem exists and a solution to remotely and independently resolve that problem). This alleviates a need to replace the AAS in the field if there is degraded IMD performance.

SUMMARY OF THE INVENTION

In a first aspect of the invention, an active antenna test system comprises: an active antenna unit comprising: test signal generator arranged to generate at least a first test signal and at least one second test signal; a plurality of transmitter modules operably coupled to the test signal generator wherein the plurality of transmitter modules are arranged to simultaneously process the first test signal and at least one second test signal to produce at least one radio frequency test signal therefrom; at least one receiver module arranged to process one or more signals falling in at least one spectral band determined to be susceptible to intermodulation distortion products caused by the at least one radio frequency test signal being generated from the first test signal and at least one second test signal; and an intermodulation determination module operably coupled to the at least one receiver module and arranged to determine a first received intermodulation performance. A first transmitter module of the plurality of transmitter modules is operably uncoupled from the test signal generator and at least a first test signal and at least one second test signal re-applied to the remaining transmitter modules, such that the intermodulation determination module determines a second received intermodulation performance in order to determine an intermodulation distortion contribution of the first transmitter module therefrom.

In this manner, an intermodulation distortion performance of individual transmit (and receive) modules can be determined. In examples, a comparison of the respective contribution of individual transmit (and receive) modules, when coupled (enabled) and uncoupled (disabled) from the test signal generator.

In an optional example, the first transmitter module of the plurality of transmitter modules may be re-coupled to the test signal generator and a second transmitter module of the plurality of transmitter modules may be operably uncoupled from the test signal generator and at least a third test signal and at least one fourth test signal applied to the remaining coupled transmitter modules, such that the intermodulation determination module determines a further received intermodulation performance in order to determine an intermodulation distortion contribution of the second transmitter module therefrom.

In an optional example, the at least one further transmitter module of the plurality of transmitter modules may be re-coupled to the test signal generator and the at least one further transmitter module may be operably uncoupled from the test signal generator, such that an intermodulation performance of the at least one further transmitter module(s) is sequentially determined. In this manner, a benchmark IMD performance for a plurality (or all) of the transmit modules can be determined and a number (or each) of the of individual transmit (and receive) modules can be successively uncoupled (disabled) to determine their respective contribution, with the re-coupling (re-enabling) included to revert to the benchmark set up.

In an optional example, the first test signal may substantially equal the third test signal and/or the second test signal may substantially equal the fourth test signal. In this manner, the test signals to be applied may be the same in each successive iteration of the testing routine, with the coupling/uncoupling of respective transmit modules, or the test signals to be applied may be different.

In an optional example, the test signal generator may be arranged to at least generate the first test signal and the at least one second test signal following the test signal generator being arranged to disable normal traffic being routed through the active antenna unit.

In this manner, the same transmit (and/or receive) modules for normal operation may be re-used, with their use for normal traffic being temporarily disabled (before being re-enabled in order to re-commence working with normal traffic, subject to any optimisation that may have been applied to the respective transmit (and/or receive) modules.

In an optional example, the active antenna unit may comprise an inbuilt at least one test signal source arranged to perform one or more of the following: generate at least one standardised test signal; generate at least one test signal with at least one characteristic of the air interface being operated by the active antenna unit. In this manner, antenna units may be provided that support internal IMD calibration/performance determination, thereby removing a need for a plurality of external ports. In this manner, specialist or standardised test signals may be employed to meet defined regulatory requirements.

In an optional example, the intermodulation determination module may comprise a Fast Fourier Transform module arranged to determine at least a magnitude of identified intermodulation components from the one or more signals falling in at least one spectral band determined to be susceptible to intermodulation distortion products caused by the at least one radio frequency test signal being generated from the first test signal and at least one second test signal. In this manner, by being able to perform FFTs, the intermodulation determination module may be able to identify any IMD components from other spurious signals and noise from a received signal. This may have an advantage of allowing a more accurate reading of signal degradation caused by IMD, for example, thereby allowing for more efficient mechanisms to reduce the effects of IMD on received signals.

In an optional example, the intermodulation determination module may be further arranged to measure a power level and frequency of intermodulation components of the at least one radio frequency test signal and determine therefrom a resultant impact on receiver performance for at least one order of intermodulation distortion. In this manner, a simplified measurement mechanism may be employed, and/or the IMD contribution for plurality of orders of IMD can be determined.

In an optional example, the at least one receiver may be tuned to select a predetermined frequency spectrum susceptible to at least one of the intermodulation components from an artefact of the at least one radio frequency test signal and the intermodulation determination module may be arranged to determine whether the selected at least one intermodulation component exceeds an intermodulation distortion acceptable range or falls above or below a threshold value.

In this manner, a mechanism is provided that may automatically enable the selected receiver to tune to portions of frequency spectrum that are determined as susceptible to various orders of IMD.

In an optional example, at least one processor may be arranged to rank a plurality of transmitter modules in response to their respective determined intermodulation performance. In this manner, the more problematic transmit (and receive) modules can be highlighted and, for example, removed from service.

In an optional example, at least one processor may be arranged to adjust a parameter of at least one of: the at least one transmitter module, the at least one receiver module in response to the determined intermodulation performance thereby reducing an intermodulation level of signals processed by the active antenna unit. In an optional example, the at least one processor may be arranged to adjust a parameter by applying at least one of: an attenuation factor, a gain factor, a beamform weight adjustment, to a live air interface traffic signal processed by the active antenna unit. In this manner, a means of compensating and correction of transmit (and/or receive) modules that contribute to IMD can be effected.

In an optional example, the at least one processor may be arranged to offset an effect of the applied attenuation or gain factor by applying at least one beam weight compensation value to another transmit module or receiver module. In this manner, a means of compensating for a problematic transmit (and/or receive) module may be achieved by adjustment of, say, a beamform weight compensation value on another transmit module or receiver module.

In an optional example, an interface may be operably coupled to the test signal generator such that the test signal generator and intermodulation determination module are remotely controllable via the interface. In an optional example, the test signal generator and intermodulation determination module may be remotely controllable via the interface by a software program located in the cloud.

In accordance with a second aspect of the invention, a method of determining intermodulation performance in an active antenna test system comprising an active antenna unit having a plurality of transmitter modules is described. The method comprises: generating by a test signal generator at least a first test signal and at least one second test signal; applying the first test signal and the at least one second test signal to the plurality of transmitter modules; simultaneously processing the first test signal and the at least one second test signal output from the plurality of transmitter modules to produce at least one radio frequency test signal therefrom; processing one or more signals falling in at least one spectral band determined to be susceptible to intermodulation distortion products caused by the at least one radio frequency test signal being generated from the first test signal and at least one second test signal in at least one receiver module; determining a first received intermodulation performance of the processed one or more signals; uncoupling a first transmitter module of the plurality of transmitter modules from the test signal generator; re-applying the first test signal and the at least one second test signal to the remaining transmitter modules; determining a second received intermodulation performance for the remaining transmitter modules; and determining an intermodulation distortion contribution of the first transmitter module therefrom.

In a third aspect of the invention, a non-transitory computer program product comprises executable program code for performing the method of the second aspect when the executable program code is executed at an active antenna unit.

BRIEF DESCRIPTION OF THE DRAWINGS

Embodiments of the invention will be described, by way of example only, with reference to the accompanying drawings, in which.

DETAILED DESCRIPTION

Example embodiments of the invention are described with reference to smart (or active) antenna technology used in a wireless communication system.

The following description focuses on embodiments of the invention that are applicable to active antenna arrays employed in Universal Mobile Telecommunication System (UMTS) cellular communication systems and in particular to a UMTS Terrestrial Radio Access Network (UTRAN) operating in a $3^{rd}$ generation partnership project (3GPP™) system, and evolutions to this standard such as HSPA+ or long term evolution (LTE) system. However, it will be appreciated that the invention is not limited to this particular cellular communication system, but may be applied to any wireless communication system, including satellite communication systems, employing antenna arrangements.

Example embodiments are described where a processor or multiple processors are arranged to perform a number of functional operations. In some examples, dedicated modules are described to perform a number of functional operations. Thus, hereafter, the terms should be considered as interchangeable, and implementation-dependent, such that the physical component performing the functional operation may be a signal processor or module implemented using hardware, firmware or software.

Example embodiments are described where an active antenna unit of an active antenna test system comprises an intermodulation modulation distortion (IMD) determination module. However, in other examples, it is envisaged that the active antenna unit may be connectable to a remote IMD determination module or a distinct IMD determination module that is operably coupleable to the active antenna unit. In some examples, the IMD module may be a software module, comprising connectable circuits that may be used in the signal processing of the array.

Figure 2:
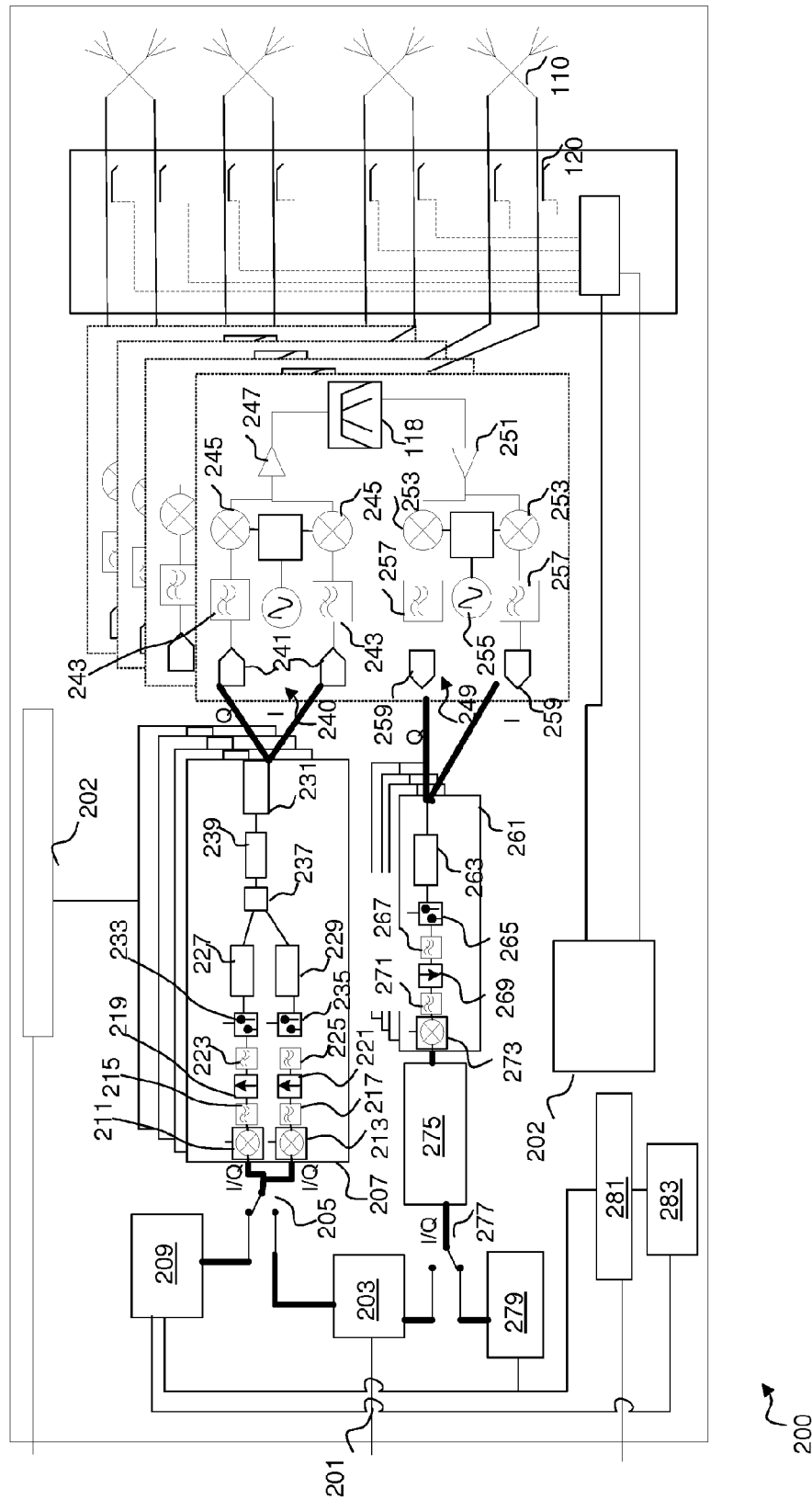
FIG. 2 illustrates an example of an active antenna array system (AAS) architecture according to aspects of the invention.

Referring to FIG. 2, an example of an AAS architecture 200 comprising an active antenna test system according to aspects of the invention is illustrated.

In one example, a CPRI interface 201 is coupled to a CPRI decode/encode logic module 203 that may be operable to decode a signal(s) from a baseband unit (not shown). Alternative interfaces, such as ORI (Open Radio Interface), may be considered, and this should be considered as being within the teachings of this application. The signal from the CPRI decode/encode logic module 203 is input to a switching module 205. In a first mode, switching module 205 is operable to pass the signal output from the CPRI logic 203 to at least one transmit baseband processing circuit 207, which may be arranged to perform functions including, but not limited to, for example, system control, beamform manipulation and additional signal processing. In a second mode, switching module 205 is operable to isolate the at least one transmit baseband processing circuit 207 from the signal output from the CPRI decode/encode logic module 203. In the second mode, the switching module 205 may be operable to couple a test signal source 209 to the at least one transmit baseband processing circuit 207. This transition may occur if the AAS architecture 200 is in a test-mode operating state. The test signal source 209 may generate a test signal, for example, a tonal signal as used in conventional IP3 and IMD testing, or a signal comprising characteristics similar to an air interface being utilised. In some examples, at least one processor 202 may be arranged to function as a test signal generator/test signal source 209 arranged to perform one or more of the following: generate at least one standardised test signal; generate at least one test signal with at least one characteristic of the air interface being operated by the active antenna unit. In some examples, the test signal source 209 may synthesise the test signal form on-board logic, or load the test signal from a memory, for example a read only memory (ROM).

In this example, transmit baseband processing circuit 207 may receive at least two signals from test signal source 209 or a signal from CPRI decode/encode logic 203. In some cases the first baseband signal can be the same or the second baseband signal. In either case, beamform weights may be applied via complex multiplication stages 211, 213 to the signal to each signal respectively. In one example, the complex multiplication stages 211, 213 may adjust the amplitude and phase of the signal passing there through to each signal respectively. In this context, a complex multiplier is one that uses a complex number in Cartesian format in order to multiply another signal represented in Cartesian format (namely the IQ signal) on the logical channel. The outputs from the two complex multiplication stages 211, 213 are then passed through filter and interpolation stages. Thus, the outputs from the two complex multiplication stages 211, 213 are passed through first low pass filters 215, 217, interpolation functions 219, 221, and second low pass filters 223, 225. The purpose of the first 215, 217 and second 223, 225 low pass filters is to spectrally filter the signals to conform to spectral mask requirements of the transmitter and limit aliasing as part of the interpolation. The interpolation functions 219, 221 are used to transform the sample rate to that required by subsequent signal processing functions, such as digital-up-converters (DUC) 227, 229, and digital pre-distorter (DPD) 231.

The filtered and interpolated signals output from second low pass filters 223, 225 are then processed by latency adjustment blocks 233, 235 using correction adjustment. The latency adjustment blocks 233, 235 could be for example an integer sample delay line circuit or a Lagrange sample interpolator. In one example, a combination of both schemes could be applied in implementing the latency adjustment function. A Lagrange sample interpolator is a means of achieving non-integer clock delays of adjustment on the signal processing path. The latency adjustment blocks (e.g. Lagrange sample interpolator) 233, 235, interpolation functions 219, 221 and second low pass filters 233, 225 process signals in the Cartesian digital domain. In this manner, digital 'I' and 'Q' paths may be processed independently.

The output of latency adjustment blocks 233, 235 are input to the DUCs 227, 229. One example purpose of the DUCs 227, 229 is to convert the digital signals at the input, to a complex intermediate frequency (IF) output. For example, an input baseband signal centred at 0 Hz, may be up-converted to be centred at, for example, −50 MHz. Since the signals are in Cartesian IQ format, the carrier can be a centred positive or negative frequency about 0 Hz.

The signals in Cartesian format from the DUCs 227, 229 are then summed in summation logic 237. The output of the summation logic is then processed by a Crest Factor Reduction (CFR) signal processing block 239. One example purpose of the CFR signal processing block 239 is to reduce a peak-to-average level of the signal being processed by subsequent signal processing chains. For example, LTE and wideband code division multiple access (WCDMA) filtered signals would generally have a peak-to-average ratio of approximately 14 dB. It is known that power amplifiers (PAs) operating with a back-off of 14 dB run inefficiently. Hence, the CFR signal processing block 239 is arranged to minimise the peak to average ratio often to something in the order of 8 dB, without substantially degrading the signal's quality figure of merit, such as its error vector magnitude (EVM) or spectral mask. In this manner, the PA may be allowed to run closer to its optimum efficiency point. Since the signal potentially going to each of the antenna element feeds will not be identical, by virtue of different beam weights applied per element, a common CFR block cannot be employed for all signals of a particular polarisation. As such, an independent CFR signal processing block 239 (and consequently digital predistorter (DPD) function 231) is applied per signal processing chain basis, and/or on a per radio frequency path basis.

Figure 1:
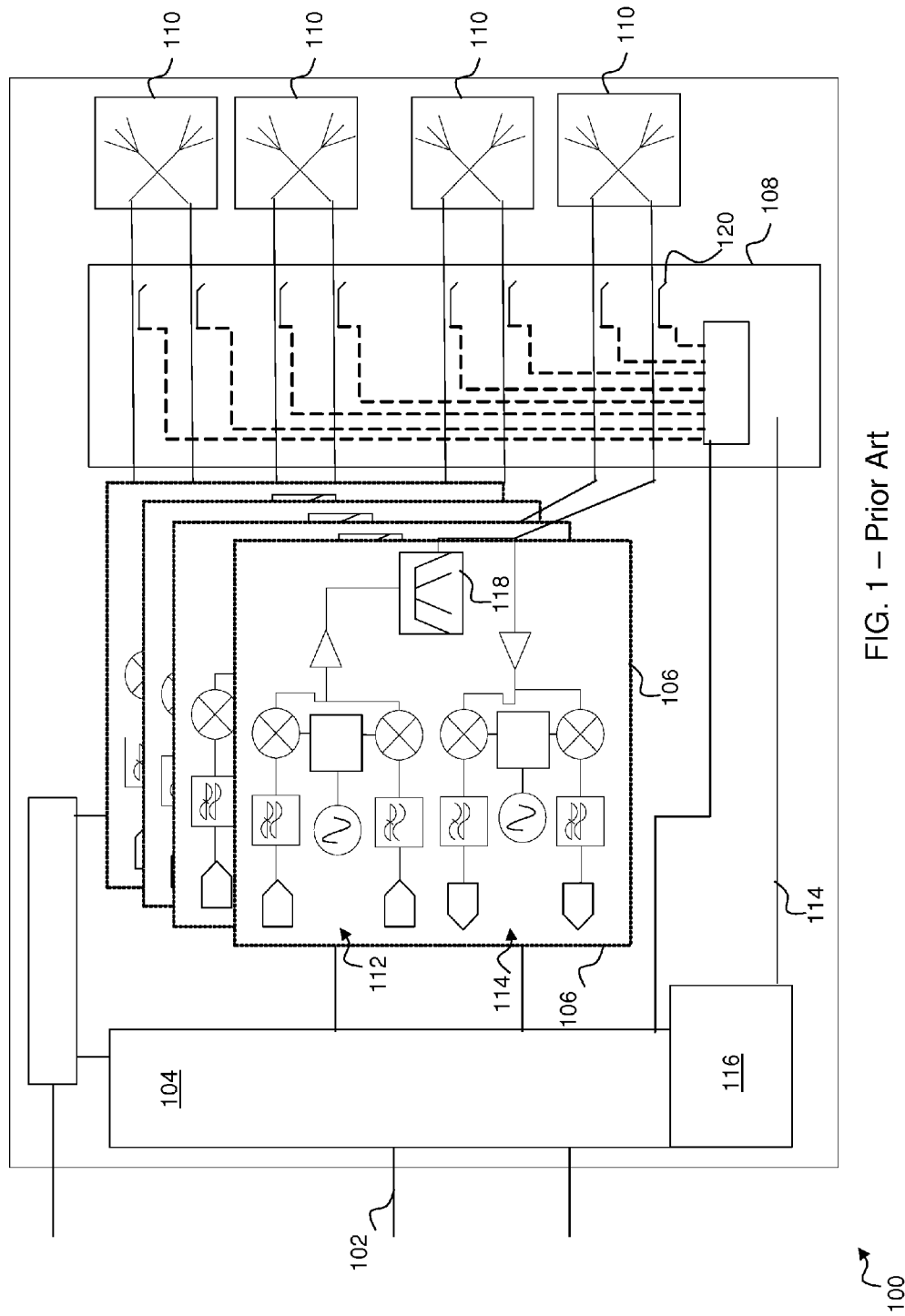
FIG. 1 illustrates a simplified block diagram of a traditional active antenna system.

The output of the CFR signal processing block 239 is input to the DPD function 231, which applies digital correction to the signal(s) based on a determined distortion caused by PA 247. The DPD function 231 corrects for power amplification distortions such as AM-AM, AM-PM and memory effects of the PA 247. A feedback point is required to sense the distortion caused by PA 247, which is not shown in FIG. 2 for the purposes of clarity. The output of the DPD function 231 is routed to a transmitter 240 comprising a pair of IQ digital to analogue convertors (DACs) 241, filters 243 and the signals up-converted to the radio frequency using IQ mixers 245. The up-converted signal is amplified at RF frequencies by PA 247 prior to routing via duplexer 118, coupler structure 120 and antenna arrangement 110, as described with respect to FIG. 1. In some examples, the output of PA 247 may optionally be coupled off (not shown) for DPD purposes.

One example of a receive circuit 249 is also shown, with the receive circuit 249 operably coupled, via the coupler structure 120 to the antenna arrangement 110. The received signals detected by the antenna arrangement 110 are forwarded by the coupler structure 120, and processed in respective duplexer 118, and respective low-noise amplifiers (LNA) 251. The LNAs 251 provide amplified versions of the received signals to a quadrature mixer 253 in order to generate respective quadrature and 'Q') down-converted signals. The quadrature mixers 253 are arranged to down-convert the respective amplified received signals based on a frequency down-conversion by selecting a local oscillator signal frequency 255. The quadrature mixer output of quadrature down-converted amplified received signals are input to respective low-pass filters 257 and thereafter to respective analogue-to-digital converters 259 in order to transform the quadrature down-converted received signal to a digital form. The resultant digital signals are passed to a receive baseband processing circuit 261.

The receive baseband processing circuit 261 receives the resultant signals via a digital-down-converter (DDC) 263. One example purpose of the DDC 263 is to convert the complex intermediate frequency (IF) signal into a digital signal, before passing the digital signal into a latency adjustment block 265, first receive low pass filter 267, decimation function 269, second receive low pass filter 271 and complex multiplication stage 273, which is operable to adjust the phase and or amplitude of the signal such as for example apply beamform weights and or correct for amplitude and phase mismatches between that of a plurality of receivers of the AAS. The resultant signal is output to a beamformer module 275, which outputs a resultant signal to a second switching module 277, which either passes the signal to the CPRI decode/encode logic 203 or to a measurement module 279. The beamformer module 275 may aggregate the signal received from a plurality of receive paths with the appropriate beamform weights to generate one aggregated output signal, for example a beam signal.

In this example, a control module 281, for example a microprocessor or microcontroller, may be operably coupled to at least the measurement module 279, the test signal source 209 and a memory 283. The control module 281 may be operable to invoke a test mode operating state to generate at least one test signal, and at least two test signals in a case of intermodulation distortion (IMD) performance testing, and be further operable to determine the effects on the test signal(s) once routed through the transmit modules and a receive module. In some examples, the memory 283 may store test result values.

In one example, the measurement module 279 may be a type of power measurement module that may be operable to determine if a received signal is within a defined range or above/below a threshold level. For example, the measurement module 279 may be a power squared meter module utilising a multiplication function in order to determine a power level of a received signal. An equation to determine the power level may then be determined by, for example, using the equation in [1].

$$P_{AoA,T}^2 = \frac{\sum_{n=1}^{N}(I_n^2 + Q_n^2)}{N} \quad [1]$$

In some other examples, the measurement module 279 may be operable to perform Fast Fourier Transforms (FFTs) on a received signal. Thus, the measurement module 279 may comprise, or be configured to perform the operation of, an intermodulation determination module that may comprise a Fast Fourier Transform (FFT) module. The FFT module may be arranged to determine at least a magnitude of identified intermodulation components from the one or more signals falling in at least one spectral band determined to be susceptible to intermodulation distortion products caused by the at least one radio frequency test signal being generated from the first test signal and at least one second test signal. By being able to perform FFTs, the measurement module 279 may be able to identify any IMD components from other spurious signals and noise from a received signal. This may have an advantage of allowing a more accurate reading of signal degradation caused by IMD, for example, thereby allowing for more efficient mechanisms to reduce the effects of IMD on received signals.

In some examples, the control module 281 and/or the measurement module 279 may be operably coupled to the transmit baseband processing circuit 207 and the receive baseband processing circuit 261 to facilitate self-healing (not shown for clarity), for example IMD self-healing.

In some examples, a processor 202 may be operably coupled to test signal source 209 in the active antenna unit 200 and may comprise an IMD spectrum determination module that is arranged to determine a frequency spectrum range that is susceptible to at least one order of intermodulation component based on at least one radio frequency test signal created by routing at least the first and second test signals from test signal source 209 through at least one of a plurality of transmit modules. The test signal spectral profile may allow for the calculation of a deterministic receive spectrum, which may be susceptible to IMD components. The processor 202 may also be couplable to at least one selected receiver to tune the selected receiver to the predetermined frequency spectrum.

In some examples, a test mode of operation may be initiated periodically by the AAS architecture 200. In other examples, a test mode of operation may be initiated remotely by a remote operator, for example via a communications link and/or a dedicated interface, or by service personnel when on site.

In this example, if a test mode of operation has been initiated, for example via a remote operator, the first switching module 205 may couple test signal source 209 to at least one transmit baseband processing circuit 207, wherein a plurality of transmit baseband processing circuits for a plurality of antenna arrangements 110 are envisaged. A second switching module 277 may couple the measurement module 279 to at least one corresponding receive baseband processing circuit 261, wherein a plurality of receive baseband processing circuits for the plurality of antenna arrangements 110 are envisaged.

It should be appreciated by skilled artisans that the switching to a test signal source 209 need not be performed within the AAS 200, and could be performed on a baseband processing unit coupled to an end of the CPRI interface 201.

In accordance with examples of the invention, a first transmitter module of the plurality of transmitter modules is operably coupled and then uncoupled from the test signal generator, for example test signal generator/source 209, where at least a first test signal and at least one second test signal of the test signal can be generated from source 209 in order to perform two distinct IMD measurements. In examples of the invention, the two distinct IMD measurements comprise a first IMD determination for signals passing through the remaining transmitter modules, when the first transmitter module is uncoupled (or disabled) and a second IMD determination for signals passing through the first transmitter module and the other transmitter modules, when the first transmitter module is coupled (or enabled). In this manner, by comparison of the two distinct measurements, an intermodulation determination module 275 may be operable to facilitate a determination of intermodulation distortion contribution of the first transmitter module.

After switching module 205 has coupled test signal source 209 to at least one transmit baseband processing circuit 207, the test signal source 209 may output at least one test signal to the relevant transmit baseband processing circuit 207, and in the case of IMD testing, output at least two test signals capable of generating an RF test signal defined by having disparate spectral content between the at least two test signals. The test signals may be, as discussed above, tonal test signals or test signals or with characteristics similar to an air interface being operated on by the AAS in network operational mode. The test signals pass through to a plurality of transmitter modules, wherein the plurality of transmitter modules are arranged to simultaneously process a first test signal and at least one second test signal to produce at least one radio frequency test signal therefrom, to be output by a relevant antenna arrangement 110.

In some examples, the same (e.g. tonal) test signal may be repeatedly applied as the first and second test signals wherein, however, the test signal may be up-converted in such a way that they are spectrally disparate as transformed to the radio frequency test signal. In other examples, it is envisaged that different (e.g. tonal) test signals may be applied as the first and second test signals, for example a subsequent iteration of the test signals applied to a further transmit module may be a third test signal and a fourth test signal.

In response to this, at least one relevant receiver may be configured to receive a spectrum determined to be susceptible to IMD components from the outputted radio frequency test signal and pass the received signal through a relevant receive baseband processing circuit 261 to the measurement module 279 via beamformer module 275 and second switching module 277.

In some examples, the same circuits/modules may be used for live normal traffic. In such a situation, when a test mode of operation is to be initiated, the test signal generator 209 may be arranged to at least generate the first test signal and the at least one second test signal following a disabling of normal traffic being routed through the active antenna unit.

In this example, the test signal output from test signal generator 209 may comprise two separate test frequencies that may be combined in summation logic 237. An advantage of using two separate test frequencies may be that PIM and IMD effects can be closely simulated. The signals from the test signal generator 209 may be the same signals that are output from the test signal generator 209. However, in some examples, a difference in the subsequent transformation process, for example digital up conversion stage 229, 227, of these signals can be converted to that of being spectrally disparate as amalgamated in the at least one radio frequency test signal. The combined test signal may be passed through the relevant transmit baseband processing circuit 207 and transmitter 240 before being output by the relevant antenna arrangement 110. Due to inherent non-linear effects introduced by the transmit circuitry and the receive circuitry, the combined test signal may allow the formation of artefact IMD component signals that may interfere with the receive circuitry 249 or signals processed there through. As a result, during the test mode, the receive circuitry 249 may be tuned or configured to receive spectrum that is determined to be susceptible to one of the spectral artefacts generated by the combined test signal as processed by non-linear circuits. Further, the DUC 227, 229 DDC 263 and receive RF LO frequencies may be tuned to receive the relevant of the determined to be susceptible spectrum.

In one example, the measurement module 279 may be, or comprise, an intermodulation determination module operably coupled to the at least one receiver module, and arranged to determine a received intermodulation performance. In one example, the measurement module 279 may facilitate determination of whether (or not) the received intermodulation performance is within a specified range or above/below a specified or threshold value. The specified range or value may be pre-programmed. If the measurement module 279 determines that the received intermodulation performance is within a specified range or above/below a specified or threshold value, it may signal this to the control module 281. In some examples, the control module 281 may store the result in memory 283.

Thus, an active antenna test system 200 comprises an active antenna unit comprising: a test signal generator 209, arranged to generate at least a first test signal and at least one second test signal; a plurality of transmitter modules operably coupled to the test signal generator wherein the plurality of transmitter modules are arranged to simultaneously process the first test signal and at least one second test signal to produce at least one radio frequency test signal therefrom; at least one receiver module arranged to process one or more signals falling in at least one spectral band determined to be susceptible to intermodulation distortion products caused by the at least one radio frequency test signal being generated from the first test signal and at least one second test signal; and an intermodulation determination module operably coupled to the at least one receiver module and arranged to facilitate determination of a first received intermodulation performance, wherein a first transmitter module of the plurality of transmitter modules is operably uncoupled from the test signal generator and at least a first test signal and at least one second test signal re-applied to the remaining transmitter modules, such that the intermodulation determination module determines a second received intermodulation performance in order to determine an intermodulation distortion contribution of the first transmitter module therefrom.

If the measurement module 279 is used to determinate that the received signal artefact is not within a specified level, the measurement module 279 may signal this to the control module 281. In response to this, the control module may initiate an optimisation procedure in order to attempt to bring the received component frequency within the specified level.

In this example, all of the transmit processing circuits 240 may be tested in turn. In one example implementation, at least two test signals are generated and applied to the plurality (or all) of transmitter modules. The test signals output from the plurality of transmitter modules are simultaneously processed to produce at least one (combined) radio frequency test signal. At 310, at least one processor 202 processes one or more signals falling in at least one spectral band determined to be susceptible to intermodulation distortion products caused by the at least one radio frequency test signal being generated from the first test signal and at least one second test signal as observed through at least one receiver module. At 311, a first received intermodulation performance of the processed one or more RF signals is determined. This sets a bench mark for the IMD performance when test signals are applied to a plurality (e.g. a majority or all) of the transmit modules. Thereafter, transmit modules are successively uncoupled to determine their effect on the IMD performance, and then re-coupled to receive test signals (to return to the benchmark state) and a next transmit module uncoupled.

This may have an advantage that the measurement module 279 is able to rank each of the transmit baseband processing circuits according to their contribution to IMD. In some examples, the ranking data may be stored in a memory, for example memory 283.

An optimisation procedure may be performed on the transmit baseband processing circuits that contribute most in terms of IMD products based on the stored ranking data. In some examples, the ranking data may optionally include details of the IMD levels measured, time of the tests and frequencies used in the tests.

In some examples, if the measurement module 279 determines that the performance of the received resultant signal(s) is still outside the specified desired value, after the relevant transmit baseband processing circuits have been optimised, based on their rank, for example, the measurement module may perform a similar test regime on receive circuits. In this mode of operation, each receive circuit may be tested in turn, and separately combined with beamformer module 275. A rank based on each of the receiver's impact on IMD may also be generated by the measurement module 279 and stored in memory.

In some examples, optimisation procedures may include reducing gain of analogue or RF gain stages, and/or disabling some or all of the worst performing transmit and/or receive circuits within the AAS architecture 200. As a result, in some examples, some of the better performing receive and transmit circuits within the AAS architecture 200 may be modified to compensate for any disabled or badly performing receive and transmit architectures. Further, in some examples, it may be necessary to alter beamform weights of the AAS architecture 200 to compensate for the resultant beam shape of the AAS architecture 200 due to IMD effects created by one or more transmit or receive modules.

Since, for example, third order intermodulation products increase three decibels for every one decibel of increased power applied to a non linear circuit, output power of a transmitter(s) could be adapted to minimised the effects of generating IMD components by decreasing the power generated by such circuits. Other optimisations could include adapting the performance of onboard algorithms such as DPD (digital predistortion) to linearize the transmitter over a larger dynamic range essentially improving the linearity and minimising IMD.

In some examples, it may be possible to adapt a frequency selective filter to shape the response in the receive circuit or transmit circuit, thereby potentially allowing for a suppression of the signals generated as IMD products from the test signals.

In some other examples the frequency plan of the AAS in terms of the frequencies used may be adapted to allow for the avoidance of IMD product artefacts from disrupting live traffic.

Figure 3:
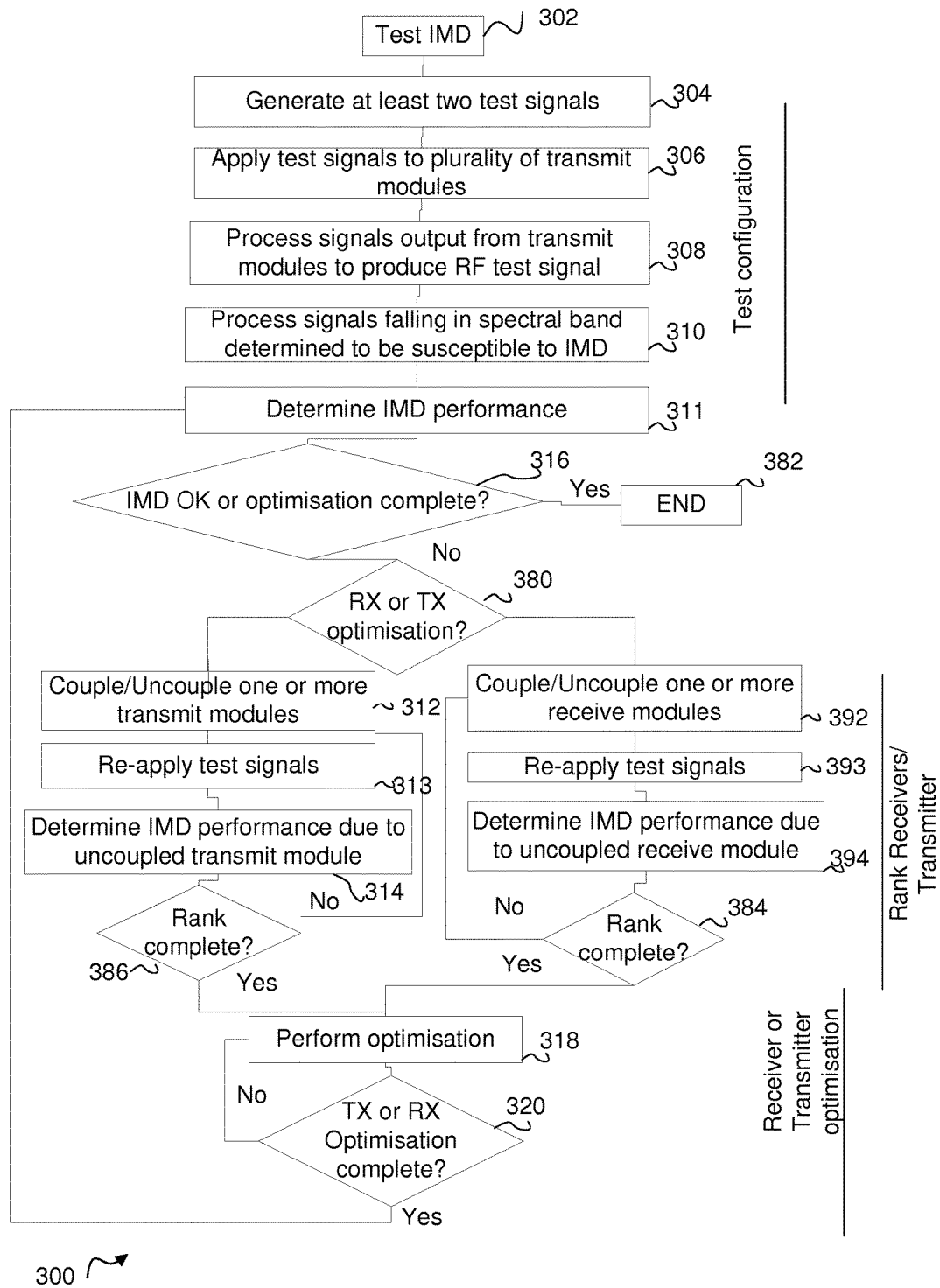
FIG. 3 illustrates a simplified test procedure that may be utilised for example in the AAS architecture of FIG. 2.

Referring to FIG. 3, a simplified test procedure 300 is illustrated, for example that may be utilised in the AAS architecture of FIG. 2. In this example, the test procedure 300 may be initiated 302 by a remote user via a communications link and/or a dedicated interface, for example by a user present at the installed AAS architecture of FIG. 2, or by an internal test scheduler within the AAS architecture of FIG. 2. The flowchart 300 commences by initiating a start of the test and optimisation at 302 with a method of determining intermodulation distortion (IMD), and optionally inclusive of PIM, performance in an active antenna test system comprising an active antenna unit having a plurality of transmitter modules. Hereafter, the term IMD performance encompasses additionally or alternatively determining a PIM performance of the various transmit or receive modules or combinations thereof.

At 304, at least a first test signal and at least one second test signal are generated. At 306, the first test signal and the at least one second test signal are applied to the plurality (or all) of transmitter modules. At 308, the first test signal and the at least one second test signal output from the plurality of transmitter modules are simultaneously processed to produce at least one radio frequency test signal. At 310, at least one processor (e.g. processor 202 from FIG. 2) in conjunction with at least one receiver circuit 249 processes a spectral band determined to be susceptible to intermodulation distortion products caused by the at least one radio frequency test signal being generated from the first test signal and at least one second test signal in at least one transmitter module and at least one receiver module. At 311, a first received intermodulation performance of the at least one transmitter module and at least one receiver module is determined. This sets a bench mark for the IMD performance when test signals are applied to a plurality (e.g. a majority or all) of the transmit modules and a plurality of receive modules (e.g. a majority or all). Thereafter, if the IMD performance is not within a specified threshold level as determined in 316 the contribution of each of the transmit or receiver as selected in 380 modules are ranked through being successively uncoupled to determine their effect on the IMD performance, and then re-coupled to receive test signals (to return to the benchmark state) and a next transmit module uncoupled.

Thus, at 312, if the IMD is not within specified limits as determined in 316 and a decision to optimize the transmitter performance of the array is determined in 380, a first transmit module of the plurality of transmitter modules is uncoupled from the test signal generator, and the first test signal and the at least one second test signal re-applied to the remaining transmit modules at 313. At 314, a second received intermodulation performance is determined for the remaining transmit modules, i.e. notably measured without the uncoupled first transmit module in order to determine an intermodulation distortion contribution of the first transmitter module.

At 386, a determination may be made as to whether the IMD performance of the uncoupled transmit module is the final one of the plurality of transmit modules, wherein the result of the IMD performance may be stored in a ranked system with the largest contributor to IMD being at the top of the ranking for any optimisation. If it is determined at 386 that the IMD measurement ranking of transmit modules is not complete, the test procedure 300 may then transition to 312 and another transmit module uncoupled and the previous uncoupled transmit module re-coupled in order to receive the first and second test signals.

If it is determined at 386 that the IMD level is ranked for a plurality of transmit modules, the test procedure 300 may determine that an optimisation routine should be performed on one or more of the transmit modules, for example including the uncoupled transmit module, at 318. For example, such an optimisation routine may comprise one or more of: varying gain/attenuation levels, adjusting power supply levels, enhancing modules within the transmit and/or the receive circuits, disabling badly performing transmit and/or receive circuits, etc. If it is determined that all possible optimisations have been performed at 320, then the newly optimised IMD performance of the AAS can be measured in 311. If the IMD is determined to be within acceptable specified thresholds, or if no more optimisations are available to the algorithm, the algorithm can end at 382. If, however, the IMD is still outside specification having completed the transmit optimisations, a determination can be made at 316 to pursue more optimisations.

At 380, since the transmit optimisation has been previously performed, an optimisation on receiver performance may be determined based on 380.

In this example, in much the same way as that pursued for transmit ranking of contributors to IMD, a first receive module of the plurality of receive modules may be uncoupled from forming an aggregated signal 392 as part of a beamforming process, and first test signal and the at least one second test signal re-applied to the transmit modules at 393. At 394, a second received intermodulation performance may be determined for the remaining receive modules, i.e. notably measured without the uncoupled first receive module in order to determine an intermodulation distortion contribution of the first receiver module.

At 384, a determination may be made as to whether the IMD performance of the uncoupled receive module is the final one of the plurality of receive modules. The result of the IMD performance may be stored in a ranked system with the largest contributor to IMD being at the top of the ranking for any optimisation. If it is determined at 384 that the IMD measurement ranking of receive modules is not complete, the test procedure 300 may then transition to 392 and another receive module uncoupled and the previous uncoupled receive module re-coupled in order to receive the first and second test signals. If it is determined at 384 that the ranking is complete an optimisation routine may be performed. A receive optimisation routine may be performed at 318. This may include increasing the current or voltage of one or more receiver circuits to influence its IMD performance. Further enhancements could include optimisation of filter responses, in order to suppress the RF test signals or IMD component artefacts generated therefrom. A further optimisation may be to decrease the gain in a receiver or uncouple a receiver from being aggregated with other signal in the beamforming process.

Thus, in some examples, each transmit module may be tested successively, thereby allowing a transmit module rank to be determined based on IMD performance. If the IMD level is still not within the threshold level, which may be predefined or vary during tests for example, each receive circuit may be tested in turn, thereby providing a rank of receive circuits based on IMD performance.

Figure 4:
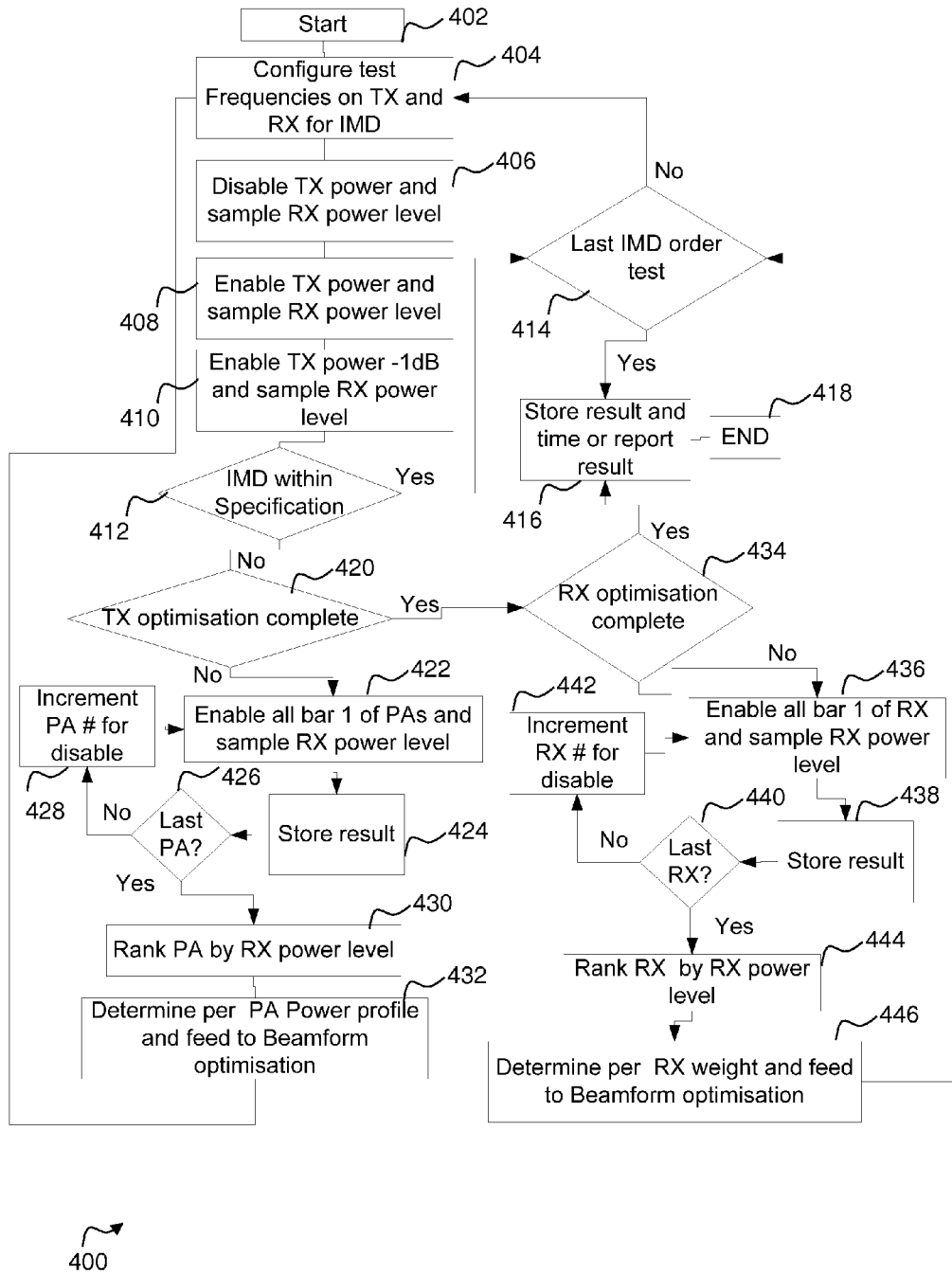
FIG. 4 illustrates a further test procedure that may be utilised for example in the AAS architecture of FIG. 2

Referring to FIG. 4, a more detailed test and self-healing procedure 400 is illustrated, which may be utilised for example in the AAS architecture of FIG. 2. In this example, the test and self-healing procedure 400 may, for example, be initiated 402 by a remote user via a communications link, by a user present at the installed AAS architecture of FIG. 2, or by an internal test scheduler within the AAS architecture FIG. 2.

The test procedure commences at 402. At 404 the test and self-healing procedure 400 selects at least two test signals/frequencies to be used for IMD testing and the test signals are applied to a plurality of transmit modules. At least one receiver is also selected and configured to receive spectrum determined to be susceptible to the IMD products of the at least two test signals/frequencies output of the plurality of (or all) transmit modules. The spectrum susceptible to IMD products may be determined by, for example, selecting a separation of "f", knowing the first "f1" lower and the at least second "f2" higher signal frequencies of the at least one radio frequency test signal as located in the RF spectrum. For example in third order IMD, the band susceptible to this third order IMD, as known in the art, is located at "f2+f" in the spectrum or "f1−f". Depending on the IMD order of the test, the first "f1" lower and the at least second "f2" higher signal frequencies may be selected in conjunction with the receiver spectrum selection to carry out the IMD test. At 406, all transmit modules are disabled, and the selected receiver(s) samples the receive power level to determine an ambient RF noise level, thus allowing for an accurate assessment of the IMD signal artefact related to the overall signal processed by the receiver. In some examples, the receiver may be arranged to sample signals in a portion of a frequency spectrum that is determined as being susceptible to at least one intermodulation component artefact of at least one of the processed radio frequency test signal created by the at least two test signals. In this manner, the receiver may be tuned to a predetermined frequency spectrum in order to, say, determine whether the selected spectrum contains at least one intermodulation component exceeding an intermodulation threshold value. In some examples, an intermodulation determination module or a processor configured to calculate intermodulation distortion may perform such a determination when operably coupled to the receiver or forming part of the selected receiver. In one example, an intermodulation determination module, as part of the processor or operably coupled to the processor may comprise a Fast Fourier Transform module arranged to determine at least a magnitude of identified intermodulation components from the one or more signals falling in at least one spectral band determined to be susceptible to intermodulation distortion products.

At 408, the transmit module is re-enabled and the selected receiver(s) again samples the receive power level from the all transmit modules with the at least two test signals were applied to. The receiver(s) may again be arranged to sample signals in a portion of a frequency spectrum that is determined as being susceptible to at least one intermodulation component from an artefact of at least one radio frequency test signal created by the at least two test signals. Advantageously, the power level may be compared to the previously sampled receive power level in 406, in order to determine a level of interference induced by the previously disabled transmit modules. Thereby allowing for the effect of the transmission of the at least two test signals impact on the received signal performance of the receiver modules.

Optionally, a further step could be added that allows the procedure, or algorithm, to determine 410 if the determined interference in 408 is a characteristic of IMD. For example, if the receiver is tuned to receive spectrum susceptible to a third order IMD component, reducing the transmit power by 1 dB, as shown in 410, should result in a 3 dB decrease in interference if the interference is indeed a product of third order IMD. This may ensure that any IMD performance algorithms that are run may follow predictable performance.

At 412, the test and self-healing algorithm determines whether the IMD level of the received signal is within specification. In some examples, the specification may be dictated by a programmed value, or determined by an optional threshold level detection step. If it is determined that the IMD level is within specification, the algorithm may determine at 414 if other tests are required, for example whether other IMD orders should be checked, say by re-tuning the receiver to other spectral band determined to be susceptible to intermodulation distortion products. If the algorithm determines that no more testing is required at 414, the algorithm may store, at 416, the results of the test before the algorithm terminates at 418. In some examples, the algorithm may store the time of the test and/or the levels measured and/or frequencies used in the test. In some other examples, the algorithm may transfer these parameters to another network element, such as an Operations and Management Centre (OMC).

If, at 412, it is determined that the IMD level of the received signal is not within specification, the algorithm may, at 420, perform at least one transmit optimisation routine and determine whether all transmit optimisations have been completed. If it is determined, at 420, that not all transmit optimisations have been completed, the process may transition to 422. At 422, a sequence is initiated to test each transmit circuit to determine each transmit module's individual contribution to IMD. In this example, all bar one of the plurality of power amplifiers within the transmit circuit may be successively enabled and the resultant receive power level is sampled. In this example, disabling the power amplifier allows the entire transceiver module to substantially eliminate any signal being output from the power amplifier to the antenna arrangement. Thus in this way any the disabled power amplifier will not substantially contribute to any IMD signals measurements results. This sampled value may then be stored at 424 in a memory.

At 426, a determination is made as to whether there are more transmit modules (including, for example, power amplifiers) to test. If there are more transmit modules/power amplifiers to test within the transmit circuit, the algorithm transitions to 428 and disables a further transmit module/power amplifier (and typically re-enables a previously disabled transmit module/power amplifier), before sampling the received power level at 422. If it is determined at 426 that all transmit modules/power amplifiers have been tested for the transmit circuit, the algorithm may transition to 430, and rank the tested power amplifiers by their received power level, which may take into account respective IMD level contributions from each of the transmit modules/power amplifiers.

At 432, a modification may be applied to some transmit modules/power amplifiers based on their rank, in order to reduce their respective contribution in terms of IMD product artefacts. For example, power levels may be altered on a per transmitter basis to reduce the impact on IMD performance.

As is known in the art, backing the signal amplitude processed to IMD artefact level is not a linear scaling. For example, for $3^{rd}$ order IMD component artefacts, for every 1 dB power reduction of the transmitter output power, around a 3 dB reduction in the IMD products generated would ensue. Further, for $5^{th}$ order IMD, around a 5 dB reduction would manifest. Thus modest changes to output powers of certain power amplifiers in the array may have a disproportionate impact on the overall IMD performance. In some examples, transmitters may be limited to operate up to a certain power level. In this example, an amplitude for each transmitter module and its associated power amplifier profiles may be determined at 432 and fed to a beamform optimisation routine, for use in configuring, for example, beamformer module 211, 213 from FIG. 2. The beamform optimisation routine would, for example, trade off reduced RF power processing capability of a particular transmit module of the array with the need to maintain beam shape conformance of the AAS. The algorithm may then transition back to 404 and re-test the performance of the system as discussed above.

If, at 412, the IMD is still outside specification, and all transmit optimisations have been completed at 420, the algorithm may transition to 434 and determine whether receive circuit optimisations may be performed and if so whether they are complete. If it is determined that all receiver optimisations have been completed at 434, the process may transition to 416 and store the results as discussed above, before the process terminates at 418.

If it is determined at 434 that not all receiver optimisations have been completed, the algorithm may transition to 436 and test each receiver in turn, for example in a similar manner to that performed on the earlier transmit modules. Thus, at 436, the algorithm may enable all bar one of the receivers and sample and measure the receive power level of any IMD component artefact. This measured result of the IMD component artefact pertaining to this receive modules may then be stored at 438 in a memory.

At 440, a determination is made as to whether there are more receivers to test. If there are more receiver modules/receivers to test, the algorithm may transition to 442 to select a new receive module to test and disable a further receiver module/receiver, before sampling and measuring the received IMD component artefact power level at 436. If it is determined by the procedure at 440 that all receivers have been tested, the procedure may transition to 444 and rank the receiver module/receiver based on their impact on IMD performance.

At 446, a modification may be applied to some receiver modules/receivers based on their rank to mitigate their contribution in terms of intermodulation products. For example, the gain of analogue or RF amplifier stages may be reduced for receivers that have a disproportionate impact on IMD performance, which may be determined from the determined ranked measurement result data. In this example, receive beamform weights may be determined for each required receiver and fed to a beamform optimisation module, for example beamformer module 275 from FIG. 2. In some examples, the signal applied to the beamform optimisation module may be attenuated first to suppress its capability to generate IMD component artefacts. In some examples, this attenuation may be offset, for example, by altering other receiver beamform weights in order to compensate for the offset.

Subsequently, the algorithm may transition back to 414 to determine whether there are any more IMD tests to perform. The test may include optionally testing for third, fifth or seventh order IMD component artefacts. If there are no more different order IMD tests and optimisations to complete, the routine or algorithm may proceed to 416. The results of the test, any optimisations, and the date and time of carrying out the test may be stored in 416. This result may be stored in the AAS or in any device operably connected to it. The optimisation routine can then terminate in 418.

Figure 5:
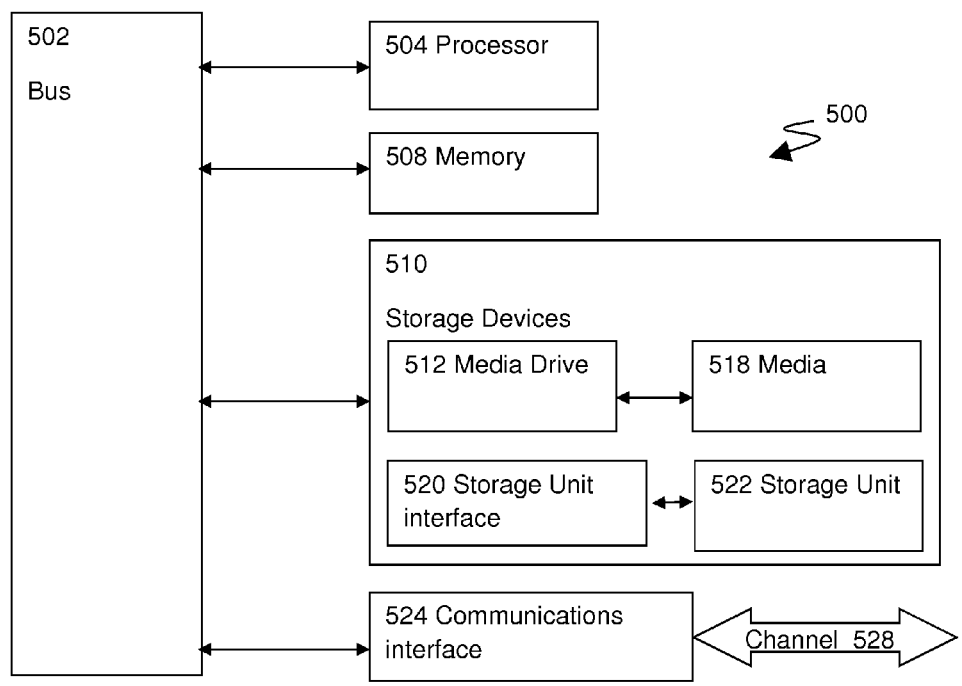
FIG. 5 illustrates a typical computing system that may be employed to implement signal processing functionality in examples of the invention.

Referring now to FIG. 5, there is illustrated a typical computing system 500 that may be employed to implement signal processing functionality in embodiments of the invention. Computing systems of this type may be used in network elements/wireless communication units. In some examples, the computer program and storage media may be located in the cloud or somewhere in the network of the operator environment, for example at an Operations and Management Centre (OMC). Those skilled in the relevant art will also recognize how to implement the invention using other computer systems or architectures. Computing system 500 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 500 can include one or more processors, such as a processor 504. Processor 504 can be implemented using a general or special-purpose processing engine such as, for example, a microprocessor, microcontroller or other control logic. In this example, processor 504 is connected to a bus 502 or other communications medium.

Computing system 500 can also include a main memory 508, such as random access memory (RAM) or other dynamic memory, for storing information and instructions to be executed by processor 504. Main memory 508 also may be used for storing temporary variables or other intermediate information during execution of instructions to be executed by processor 504. Computing system 500 may likewise include a read only memory (ROM) or other static storage device coupled to bus 502 for storing static information and instructions for processor 504.

The computing system 500 may also include information storage system 510, which may include, for example, a media drive 512 and a removable storage interface 520. The media drive 512 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 518 may include, for example, a hard disk, floppy disk, magnetic tape, optical disk, CD or DVD, or other fixed or removable medium that is read by and written to by media drive 512. As these examples illustrate, the storage media 518 may include a computer-readable storage medium having particular computer software or data stored therein.

In alternative embodiments, information storage system 510 may include other similar components for allowing computer programs or other instructions or data to be loaded into computing system 500. Such components may include, for example, a removable storage unit 522 and an interface 520, such as a program cartridge and cartridge interface, a removable memory (for example, a flash memory or other removable memory) and memory slot, and other removable storage units 522 and interfaces 520 that allow software and data to be transferred from the removable storage unit 518 to computing system 500.

Computing system 500 can also include a communications interface 524. Communications interface 524 can be used to allow software and data to be transferred between computing system 500 and external devices. Examples of communications interface 524 can include a modem, a network interface (such as an Ethernet or other NIC card), a communications port (such as for example, a universal serial bus (USB) port), a PCMCIA slot and card, etc. Software and data transferred via communications interface 524 are in the form of signals that can be electronic, electromagnetic, and optical or other signals capable of being received by communications interface 524. These signals are provided to communications interface 524 via a channel 528. This channel 528 may carry signals and may be implemented using a wireless medium, wire or cable, fibre optics, or other communications medium. Some examples of a channel include a phone line, a cellular phone link, an RF link, a network interface, a local or wide area network, and other communications channels.

In this document, the terms 'computer program product' 'computer-readable medium' and the like may be used generally to refer to media such as, for example, memory 508, storage device 518, or storage unit 522. These and other forms of computer-readable media may store one or more instructions for use by processor 504, to cause the processor to perform specified operations. Such instructions, generally referred to as 'computer program code' (which may be grouped in the form of computer programs or other groupings), when executed, enable the computing system 500 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 500 using, for example, removable storage drive 522, drive 512 or communications interface 524. The control logic (in this example, software instructions or computer program code), when executed by the processor 504, causes the processor 504 to perform the functions of the invention as described herein.

It will be appreciated that, for clarity purposes, the above description has described embodiments of the invention with reference to different functional units and processors. However, it will be apparent that any suitable distribution of functionality between different functional units or processors, for example with respect to the broadcast mode logic or management logic, may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second' etc. do not preclude a plurality.

The invention claimed is:

1. An active antenna system arranged to determine intermodulation distortion, the active antenna system comprising:
   a test signal generator arranged to generate at least a first test signal and a second test signal;

a plurality of transmitter circuits arranged to generate at least one radio frequency test signal based on at least the first test signal and the second test signal, wherein the active antenna system is arranged to couple the plurality of transmitter circuits to the test signal generator in a first state, and wherein the active antenna system is arranged to uncouple a first transmitter circuit of the plurality of transmitter circuits from the test signal generator and to couple other transmitter circuits of the plurality of transmitter circuits to the test signal generator in a second state;

at least one receiver circuit arranged to process one or more signals comprising an intermodulation distortion product caused by the at least one radio frequency test signal; and an intermodulation determination circuit operably coupled to the at least one receiver circuit and arranged to determine an intermodulation distortion contribution of the first transmitter circuit based on at least a first intermodulation performance associated with the first state and a second intermodulation performance associated with the second state.

2. The active antenna system of claim 1, wherein the active antenna system is arranged to uncouple a second transmitter circuit of the plurality of transmitter circuits from the test signal generator and to couple the remaining transmitter circuits of the plurality of transmitter circuits to the test signal generator in a third state.

3. The active antenna system of claim 2, wherein the intermodulation determination circuit is configured to determine an intermodulation distortion contribution of the second transmitter based at least partly on a third intermodulation performance associated with the third state.

4. The active antenna system of claim 2, wherein at least one processor is arranged to rank transmitter circuits of the plurality of transmitter circuits in response to their respective determined intermodulation distortion contribution.

5. The active antenna system of claim 1, wherein the test signal generator is arranged to at least generate the first test signal and the at least one second test signal while normal traffic routed through the active antenna system is disabled.

6. The active antenna system of claim 1, wherein the test signal generator is arranged to perform one or more of the following:

generate at least one standardised test signal; or
generate at least one test signal with at least one characteristic of an air interface of the active antenna system.

7. The active antenna system of claim 1, wherein the intermodulation determination circuit comprises a Fast Fourier Transform circuit arranged to determine at least a magnitude associated with the intermodulation distortion product.

8. The active antenna system of claim 7, wherein the intermodulation determination circuit is further arranged to measure a power level and frequency associated with the intermodulation distortion product.

9. The active antenna system of claim 1, wherein the at least one receiver is configured to be tuned to select a predetermined frequency spectrum susceptible to the intermodulation distortion product.

10. The active antenna system of claim 1, wherein at least one processor is arranged to adjust a parameter of at least one of the first transmitter circuit or the at least one receiver circuit in response to the determined intermodulation distortion contribution of the first transmitter circuit to thereby cause an intermodulation level of signals processed by the active antenna system to be reduced.

11. The active antenna system of claim 10, wherein the at least one processor is arranged to adjust the parameter by applying at least one of: an attenuation factor, a gain factor, a beamform weight adjustment, a filter adjustment, a digital predistortion adjustment, or a frequency plan of used frequencies applied to at least one live air interface traffic signal processed by the active antenna system.

12. The active antenna system of claim 1, wherein an interface is operably coupled to the test signal generator such that the test signal generator is remotely controllable via the interface.

13. A method of determining intermodulation performance in an active antenna system, the method comprising:

generating, with a plurality of transmitter circuits coupled to a test signal generator configured to provide at least a first test signal and a second test signal, at least one radio frequency test signal from at least the first test signal and the second test signal;

determining, by an intermodulation determination circuit, a first intermodulation performance based on the at least one radio frequency test signal;

generating, with a first transmitter circuit of the plurality of transmitter circuits uncoupled from the test signal generator and the remaining transmitter circuits of the plurality of transmitter circuits coupled to the test signal generator, at least one second radio frequency test signal from at least the first test signal and the second test signal;

determining, by the intermodulation determination circuit, a second intermodulation performance based on the at least one second radio frequency test signal; and determining an intermodulation distortion contribution of the first transmitter circuit based on the first intermodulation performance and the second intermodulation performance.

14. The method of claim 13, further comprising determining an intermodulation distortion contribution for a second transmitter of the plurality of transmitter circuits based at least partly on a third intermodulation performance associated with the second transmitter circuit being uncoupled from the test signal generator and the remaining transmitter circuits of the plurality of transmitter circuits being coupled to the test signal generator.

15. The method of claim 13, wherein the first transmitter circuit is coupleable to the intermodulation determination circuit by way of at least one receiver circuit, and the method further comprises adjusting a parameter of at least one of the transmitter circuit or the at least one receiver circuit to thereby reduce intermodulation distortion in the active antenna system.

16. The method of claim 15, further comprising:

determining an updated intermodulation performance of at least one of the plurality of transmitter circuits or the at least one receiver circuit following the adjusting the parameter; and performing a further adjustment of the parameter in response to the updated intermodulation performance.

17. An active antenna system arranged to determine intermodulation distortion, the active antenna system comprising:

a plurality of receiver circuits;
a beamformer circuit configured to generate an aggregated signal from output signals of the plurality of receiver circuits; and
an intermodulation determination circuit operably coupled to the beamformer circuit, the intermodulation determination circuit configured to determine an intermodulation distortion contribution of a first receiver circuit of the plurality of receiver circuits based at least partly on a first intermodulation distortion associated with a first state and a second intermodulation distortion associated with a second state, wherein the plurality of receiver circuits are coupled in the first state, and wherein the first receiver circuit is uncoupled in the second state and other receiver circuits of the plurality of receiver circuits are coupled in the second state.

18. The active antenna system of claim 17, wherein a second receiver circuit of the plurality of receivers is uncoupled in a third state and the remaining receiver circuits of the plurality of receiver circuits are coupled in the third state, and the intermodulation determination circuit is configured to determine a second intermodulation distortion contribution of a second circuit based at least partly on a third intermodulation distortion associated with the third state.

19. The active antenna system of claim 17, further comprising:
    a test signal generator arranged to generate at least a first test signal and a second test signal; and
    a plurality of transmitter circuits arranged to generate at least one radio frequency test signal based on at least the first test signal and the second test signal, the plurality of transmitter circuits being coupleable to the plurality of receiver circuits.

20. The active antenna system of claim 17, further comprising a switching circuit configured to:
    couple the beamforming circuit to a decode/encode logic circuit in a first mode; and
    couple the beamforming circuit to the intermodulation determination circuit in a second mode.

21. A method of determining intermodulation performance in an active antenna system, the method comprising:
    determining, with an intermodulation determination circuit operatively coupled to a beamformer configured to generate an aggregated signal from output signals of a plurality of receiver circuits, a first intermodulation distortion associated with a first state, wherein the plurality of receiver circuits are enabled in the first state;
    disabling a first receiver circuit of the plurality of receiver circuits and enabling the remaining receiver circuits of the plurality of receiver circuits in a second state;
    determining, with the intermodulation determination circuit, a second intermodulation distortion associated with the second state; and
    determining an intermodulation distortion contribution of the first receiver circuit based at least partly on the first intermodulation distortion and the second intermodulation distortion.

22. The method of claim 21, further comprising adjusting a parameter of the first receiver circuit based at least partly on the intermodulation distortion contribution of the first receiver circuit to cause intermodulation distortion to be reduced.

23. The method of claim 21, further comprising determining a second intermodulation distortion contribution of a second receiver circuit of the plurality of receiver circuits.

24. The method of claim 21, further comprising ranking intermodulation distortion contributions of each of the plurality of receiver circuits.

* * * * *

UNITED STATES PATENT AND TRADEMARK OFFICE
CERTIFICATE OF CORRECTION

| | | |
|---|---|---|
| PATENT NO. | : 10,067,171 B2 | Page 1 of 1 |
| APPLICATION NO. | : 15/129746 | |
| DATED | : September 4, 2018 | |
| INVENTOR(S) | : Conor O'Keeffe et al. | |

It is certified that error appears in the above-identified patent and that said Letters Patent is hereby corrected as shown below:

On the Title Page

Item (71), Applicant, Line 1, after "ANALOG DEVICES GLOBAL" insert --, Hamilton, (BM)--.

In the Specification

Column 8, Line 62, after "quadrature" insert --('I'--.

In the Claims

Column 22, Line 47, in Claim 15, after "the" insert --first--.

Signed and Sealed this
Eleventh Day of December, 2018

Andrei Iancu
*Director of the United States Patent and Trademark Office*